Figure 1:
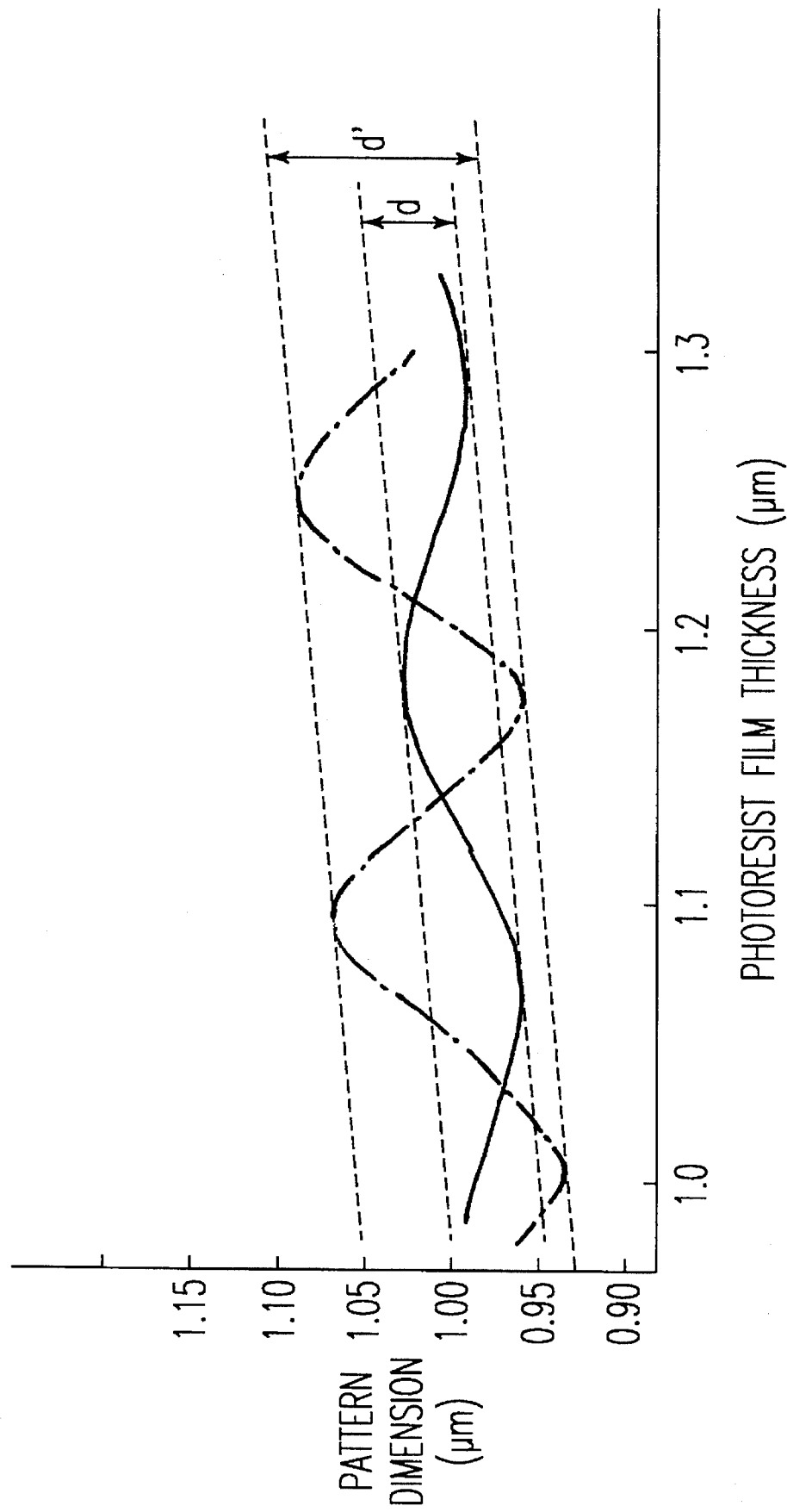

United States Patent [19]

Nishi et al.

[11] Patent Number: 5,514,526
[45] Date of Patent: May 7, 1996

[54] FLUORINE-CONTAINING COMPOSITION FOR FORMING ANTI-REFLECTION FILM ON RESIST SURFACE AND PATTERN FORMATION METHOD

[75] Inventors: Mineo Nishi; Hideo Makishima, both of Kitakyushu, Japan

[73] Assignee: Mitsubishi Chemical Corporation, Tokyo, Japan

[21] Appl. No.: 182,159

[22] PCT Filed: May 27, 1993

[86] PCT No.: PCT/JP93/00711

§ 371 Date: Feb. 2, 1994

§ 102(e) Date: Feb. 2, 1994

[87] PCT Pub. No.: WO93/24860

PCT Pub. Date: Dec. 9, 1993

[30] Foreign Application Priority Data

Jun. 2, 1992 [JP] Japan .................. 4-141805

[51] Int. Cl.$^6$ ................ G03C 5/00; G03C 1/73
[52] U.S. Cl. .............. 430/325; 430/273.1; 524/805
[58] Field of Search ................... 430/325, 273; 524/805

[56] References Cited

U.S. PATENT DOCUMENTS 3,960,559  6/1976  Suzuki et al. ............ 430/323
4,575,399  3/1986  Tanaka et al. .

FOREIGN PATENT DOCUMENTS

| | | |
|---|---|---|
| 0522990 | 1/1993 | European Pat. Off. . |
| 51-10775 | 1/1976 | Japan . |
| 54-114977 | 9/1979 | Japan . |
| 59-93448 | 5/1984 | Japan . |
| 60-38821 | 2/1985 | Japan . |
| 60-158623 | 8/1985 | Japan . |
| 62-42160 | 2/1987 | Japan . |
| 62-62520 | 3/1987 | Japan . |
| 62-62521 | 3/1987 | Japan . |
| 3222409 | 10/1991 | Japan . |
| 6-148896 | 5/1994 | Japan . |

*Primary Examiner*—Marion E. McCamish
*Assistant Examiner*—Laura Weiner
*Attorney, Agent, or Firm*—Oblon, Spivak, McClelland, Maier & Neustadt

[57] ABSTRACT

A composition for forming anti-reflection film on resist surface which comprises an aqueous solution of a water soluble fluorine compound, and a pattern formation method which comprises the steps of coating a photoresist composition on a substrate; coating the above-mentioned composition for forming anti-reflection film; exposing the coated film to form a specific pattern; and developing the photoresist, are provided. Since the composition for forming anti-reflection film can be coated on the photoresist in the form of an aqueous solution, not only the anti-reflection film can be formed easily, but also, the film can be removed easily by rinsing with water or alkali development. Therefore, by the pattern formation method according to the present invention, it is possible to form a pattern easily with a high dimensional accuracy.

23 Claims, 1 Drawing Sheet

5,514,526

FLUORINE-CONTAINING COMPOSITION FOR FORMING ANTI-REFLECTION FILM ON RESIST SURFACE AND PATTERN FORMATION METHOD

TECHNICAL FIELD

This invention relates generally to a composition for forming anti-reflection film on resist surface in carrying out pattern formation with photoresist sensitive to radiation, and also relates to a pattern formation method using the composition.

BACKGROUND ART

The minuteness of pattern has been progressed together with the increase in the degree of integration of semiconductor elements. Photolithography using light as exposure source has been used there. At present, reduction step-and-repeat projection exposure method is the main current because of high resolution and excellent alignment accuracy. There are problems in fine pattern formation by a single-layer resist method using photolithography, that is, change or variation in pattern dimension caused by local change in resist film thickness due to the unevenness of substrate or substrate topography (bulk effect), and dwindling in pattern dimension caused by local overexposure on resist due to scattering light from side wall part of substrate topography (notching effect). Furthermore, since the reduction step-and-repeat projection exposure uses refractive optics, monochromatic light is used as exposure source, and the use of monochromatic light causes another problem.

Namely, there occurs interferences one another between incident beam to a resist, reflected beam from a resist surface, and reflected beam from a resist/substrate interface, which causes change in effective quantity of light absorbed in the resist according to slight change in resist film thickness at a period of $\lambda/2n$ ($\lambda$: exposing wavelength, n: refractive index of resist), which in turn causes change in resist pattern dimension (multiple in-film reflection effect), or causes periodical distribution of light strength in the direction of resist thickness, which in turn causes corresponding corrugation in the section of resist pattern after development (standing wave effect). All of these produce change in resist pattern dimension and poor resolution.

As ways to solve these problems of the prior single-layer resist method, there have been proposed a multi-layer resist method, an ARC method and an ARCOR method. In the multi-layer method, however, there are problems such as a number of process steps and low throughput, since three resist layers are formed and thereafter pattern is transferred to form resist pattern used as mask. In the ARC method, there are problems such as much amount of side etching and much decrease in dimensional accuracy thereby since an anti-reflection film formed underneath resist is wet-etched by development. The ARCOR method is a method to suppress multi-reflection in a resist film by coating one layer or multiple layers of an interference-type anti-reflection film comprising oil-soluble perfluoroalkyl compound on the resist film. The anti-reflection film used, however, cannot be coated as an aqueous solution and thus it is coated as a solution in a solvent. Therefore, the anti-reflection film cannot be removed of course by rinsing, which leads to problems that it makes the procedure complex, and that the number of process steps and materials used increase. The multi-layer resist method is described in Japan Patent Laid-Open Specification Sho 51- 10775 etc. The ARC method is described in Japan Patent Laid-Open Specification Sho 59-93448 and the ARCOR method is described in Japan Patent Laid-Open Specification Sho 62-62520.

The present invention is made under such background, and an object of the present invention is to provide a composition for forming surface anti-reflection film on photoresist film at the time of formation of a pattern. Furthermore, another object is to provide a method to improve change in a resist pattern dimension and resolution at the time of formation of a pattern, wherein the composition for forming anti-reflection film can be coated as an aqueous solution, and wherein the obtained anti-reflection film can be removed after formation of resist pattern by a convenient method such as rinsing and alkali development, which are usual post-treatments.

DISCLOSURE OF THE INVENTION

The present inventors have investigated variously in order to solve such problems and as a result have found that when a water soluble fluorine compound is coated on a photoresist, the formed film of water soluble fluorine compound can be easily removed by rinsing or development and is superior as an anti-reflection film. Based on this finding, the inventors have accomplished the invention.

Namely, an aspect of the present invention exists in a composition for forming anti-reflection film on resist surface which comprises an aqueous solution of a water soluble fluorine compound. Also, another aspect exists in pattern formation method which comprises the steps of coating a photoresist composition on a substrate; coating on the obtained photoresist a composition for forming anti-reflection film on resist surface; exposing the photoresist and the obtained surface anti-reflection film to form a specific pattern; and developing the photoresist with an aqueous alkaline solution, characterized in that a composition comprising an aqueous solution of a water soluble fluorine compound is used as the said composition for forming anti-reflection film on resist surface.

Now, the invention will be described in detail.

In the composition for forming anti-reflection film on resist surface according to the present invention, the water soluble fluorine compounds are not particularly limited as long as they are water soluble fluorine compounds. Some examples may be mentioned here as follows:

Perfluoroalkyl carboxylic acids and salts thereof such as ammonium perfluorononane carboxylate ($C_9F_{19}COONH_4$) etc., perfluoroalkyl sulfonic acids and salts thereof such as ammonium perfluorooctane sulfonate ($C_8F_{17}SO_3NH_4$) etc., perfluoroalkyl benzene sulfonic acids and salts thereof such as p-perfluorononyl benzene sulfonic acid shown by the following formula (I) etc., perfluoroalkyloxy benzene sulfonic acids and salts thereof such as p-perfluorononyloxy benzene sulfonic acid shown by the following formula (II) etc., perfluoroalkyl amines and salts thereof such as perfluorononyltrimethyl ammonium chloride shown by the following formula (III) etc., perfluoroalkyl sulfonamides such as N-propyl-N-(2-hydroxyethyl)perfluorooctane sulfonamide shown by the following formula (IV) etc., and perfluoroalkyl alcohol-ethylene oxide adducts and derivatives thereof such as α-perfluorononenyl-ω -methoxypolyoxyethylene ($C_9F_{17}O\text{-}(CH_2CH_2O)_{20}CH_3$ etc.).

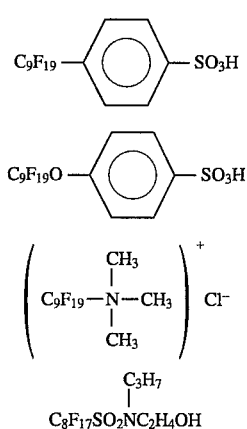

$$C_9F_{19}\!\!-\!\!\langle\bigcirc\rangle\!\!-\!\!SO_3H \quad (I)$$

$$C_9F_{19}O\!\!-\!\!\langle\bigcirc\rangle\!\!-\!\!SO_3H \quad (II)$$

$$\left(\begin{array}{c}CH_3\\|\\C_9F_{19}\!\!-\!\!N\!\!-\!\!CH_3\\|\\CH_3\end{array}\right)^{\!+} Cl^- \quad (III)$$

$$\begin{array}{c}C_3H_7\\|\\C_8F_{17}SO_2NC_2H_4OH\end{array} \quad (IV)$$

As the above-mentioned salts of carboxylic acids and sulfonic acids, there are mentioned inorganic salts such as sodium salts and ammonium salts as well as organic salts such as alkylamine salts. As the above-mentioned salts of the amines, there are mentioned inorganic salts such as hydrochlorides and sulfates etc., organic acid salts such as carboxylic acid salts, as well as quaternary salts.

Water solubility of the water soluble fluorine compound used in the present invention is usually 1 wt % or more. Among the said water soluble fluorine compounds, perfluoroalkyl carboxylic acids and salts thereof and perfluoroalkyl alcohol-ethylene oxide adducts and derivatives thereof are preferable from the view point of solubility.

The composition of the present invention is used to form a surface anti-reflection film by coating the composition on the photoresist film, and thus it is preferable to use water soluble perfluoroalkyl alcohol-ethylene oxide adducts and/or derivatives thereof (A) together with other water soluble fluorine compound (B) as the water soluble fluorine compound from the view points of coating property and anti-reflection effect of the coated film.

Compounding ratio in this case is usually (A)/(B)= 9/1–1/9 (ratio by weight), and preferably (A)/(B)=8/2– 2/8. As to the above-mentioned ratio, if B is too low, pattern dimensional accuracy may be decreased, and if B is too much, the accuracy may be also decreased. As the other water soluble fluorine compound (B), there are recommended perfluoroalkyl carboxylic acids and salts thereof, perfluoroalkyl sulfonic acids and salts thereof, perfluoroalkyloxy benzene sulfonic acids and salts thereof, perfluoroalkyl benzene sulfonic acids and salts thereof, perfluoroalkyl amines and salts thereof, and perfluoroalkyl sulfonamides. Perfluoroalkyl carboxylic acid salts are particularly preferable, and mixtures of perfluoroalkyl carboxylic acid salts with perfluoroalkyl alcohol-ethylene oxide adducts and/or derivatives thereof are most preferable from the view points of anti-reflection effect and film formation.

Further, the composition of the present invention may contain a water soluble macromolecular compound in addition to the water soluble fluorine compound. As the water soluble macromolecular compound, any well-known soluble macromolecular compound may be used, and there may be mentioned for example starch and derivatives thereof, gelatin, casein, alginic acid, cellulose derivatives, polyvinyl alcohol, polyvinyl pyrrolidone, polyacrylic acid, polyacrylic amide, polymethacrylic acid, polymethyl vinyl ether, polyvinyl ethyl ether and polyethylene glycol. Among them polyvinyl pyrrolidone is preferable.

Ratio of the water soluble fluorine compound (C) to the water soluble macromolecular compound (D) in this case is usually C/D=9.5/0.5–0.5/9.5 (ratio by weight), and preferably C/D=9/1–4/6.

To contain the water soluble macromolecular compound in the aqueous solution of the water soluble fluorine compound has the effect of improving stability of the coated film.

The composition of the present invention is an aqueous solution of the above-mentioned water soluble fluorine compound. The amount of the water soluble fluorine compound added to water is not particularly limited provided that the aqueous solution is formed. A concentration used in forming the anti-reflection film is usually 1–30% by weight, preferably 3–25% by weight, based on water. The composition of the present invention may be produced as a composition of higher concentration beforehand and then diluted to the above-mentioned concentration when it is used.

The pattern formation method according to the present invention is characterized in that the composition according to the present invention comprising the aqueous solution of the water soluble fluorine compound is coated on the photoresist film before exposure, in the known pattern formation method comprising the steps of coating a photoresist composition on a substrate, exposing the obtained photoresist film to form a specific pattern and developing the said photoresist with an aqueous alkaline solution.

As the photoresist composition used in the present invention, either positive type or negative type may be used, and various known photoresist compositions may be used. As positive type photoresist compositions, there may be mentioned naphthoquinone diazide type positive photoresist compositions usually comprising alkali-soluble resins, naphthoquinonediazide type photosensitizers and a solvent. (For example, see Japan Laid-Open Specification Sho 61-118744.)

As chemical amplification type positive photoresists, there are mentioned for example combinations of a polymer wherein hydroxyl group of polyhydroxystyrene is protected by t-butoxy carbonyl group and a photo-acid-generating material (see H. Ito, C. G. Willson: Polym. Eng. Sci., 23, 1012 (1983)) etc.

As chemical amplification type negative photoresists among the negative type photoresist compositions, there are mentioned photoresist compositions comprising alkali-soluble resins, hexamethoxymelamine as a crosslinking agent and photo-acid-generating material. (For example, see W. E. Feely, J. C. Imhof, C. M. Stein, T. A. Fisher, M. W. Legenza: Polym. Eng. Sci., 26, 1101 (1986)).

The substrates used in the pattern formation method according to the present invention are not particularly limited, and substrates for IC manufacturing such as silicone substrates and galium-arsenide substrates are generally used.

The method to coat the photoresist composition on the substrate is carried out in any usual way, for example, using a spin-coater etc.

Film thickness of the obtained photoresist is usually about 0.3–5.0 μm.

Heat-and-dry treatment after coating the photoresist on the substrate is carried out with a hot plate etc. usually at 70°–100° C. for 30–120 seconds.

The pattern formation method according to the present invention is characterized in that the above-mentioned composition comprising the aqueous solution of the water soluble fluorine compound is coated on the photoresist to form the surface anti-reflection film.

Film thickness of the anti-reflection film may be optimized appropriately according to exposing wavelength etc.

Since the composition comprising the aqueous solution of the water soluble fluorine compound is used as the composition to form the anti-reflection film, the formed anti-reflection film can be easily removed after exposure with an aqueous alkaline solution during development or simply by rinsing with water. Further, since such anti-reflection film is formed on the photoresist, change in resist pattern dimension and resolution are improved.

Although the coated film formed on the photoresist film comprising water soluble fluorine compound can be removed by an aqueous alkali developer during development after exposure, it is preferable to remove it previously by rinsing with water before development.

As the exposing wavelengths used in carrying out image transfer against the photoresist film formed on the substrate, there are generally mentioned g-line (436 nm), i-line (365 nm), Xe-Cl excimer laser radiation (308 nm), Kr-F excimer laser radiation (248nm) or Ar-F excimer laser radiation (193 nm), but additionally multi-wavelengths may be used.

After exposure of the photoresist film and the anti-reflection film, post-exposure-baking (PEB) may be carried out if required. PEB is preferably carried out using a hot plate etc. at 90°–120° C. and for 60–120 seconds. A convection oven may be substituted for the hot plate, and in this case it takes usually longer time than the case using the hot plate.

As aqueous alkaline solutions to develop the photoresist after exposure, aqueous solutions of inorganic alkalis such as sodium hydroxide, potassium hydroxide, sodium carbonate, ammonia, sodium silicate, sodium metasilicate etc., primary amines such as ethylamine and n-propylamine etc., secondary amines such as diethylamine and di-n-propylamine, tertiary amines such as triethylamine and methyldiethylamine etc., and quaternary ammonium salts such as tetramethylammonium hydroxide and trimethylhydroxyethylammonium hydroxide etc., themselves or mixed with alcohol etc. may be used.

Further, a surfactant etc. may be added and used, if required. It is desirable that development time is about 0–180 seconds and development temperature is about 15°–30° C. Photoresist developer is used after filtration for removing insolubles.

A BRIEF DESCRIPTION OF DRAWINGS

FIG. 1 is a drawing showing relationships between photoresist film thickness and pattern dimension in Example-1 and Comparative Example-1.

BEST MODE FOR CARRYING OUT THE INVENTION

Some embodiments of the invention are explained more precisely as follows by Examples, but the invention is not limited to the following Examples without departing the spirit and the range of the invention.

EXAMPLE 1

Positive type photoresist MCPR-2000H (manufactured by Mitsubishi Kasei Corporation, trade name) was coated on plural bare silicone wafers by means of a spin coater, and then prebaked for 90 seconds at 80° C. to form photoresist coated films with a thickness of 1.0–1.3 μm respectively.

Thereafter, 20 wt % aqueous solution of ammonium perfluoroalkyl carboxylate (Unidyne DS-101 manufactured by Daikin Industries Ltd., trade name) was coated on each photoresist, and prebaked for 90 seconds at 80° C. to form anti-reflection films with thickness of 700 angstrom comprising films of ammonium perfluoroalkyl carboxylate.

Then, 1.0 μm pattern was transferred on the films by means of an exposing apparatus (NSR 1755i7A manufactured by Nikon Corporation) in the same exposure energy, and the wafers were rinsed by pure water, to remove the anti-reflection films by dissolution, and then resist patterns were formed by developing with 2.38 wt % aqueous solution of tetramethylammonium hydroxide at 23° C. for 50 seconds. Pattern dimensions were measured for each wafer and relationship between thickness of photoresist coated film and pattern dimension is shown in FIG. 1 as a solid line.

In FIG. 1, pattern dimension variable d (=dimensional controllability) was obtained from a straight line connecting lowest points of the pattern dimension variation curve and the uppermost point of the curve. The results are shown in Table-1. Also, coating film properties of the anti-reflection film (property of combination of coating property and property-maintaining stability of the coated film), as well as removability evaluated after development are shown in Table-1.

EXAMPLE 2

The procedure was carried out and evaluation was made analogously to Example-1 except that an aqueous solution of a mixture of a derivative of perfluoroalkyl alcoholethylene oxide adduct ($A_1$) (Futergent 250 manufactured by Neos Co. Ltd., trade name) and ammonium perfluoroalkyl carboxylate used in Example-1 ($B_1$) (ratio by weight: $(B_1)/(A_1)=7/3$, concentration: 10% by weight) was coated instead of an aqueous solution of ammonium perfluoroalkyl carboxylate.

The results are shown in Table-1.

EXAMPLE 3

The procedure was carried out and evaluation was made analogously to Example-1 except that an aqueous solution of a mixture of ammonium perfluoroalkyl carboxylate ($B_1$) and perfluoroalkyl alcohol-ethylene oxide adduct ($A_2$) as water soluble fluorine compounds, and polyvinyl pyrrolidone ($C_1$) as water soluble macromolecular compound at ratio by weight of $B_1/A_2/C_1=7.5/0.5/2.0$ was coated.

Thus, good results are obtained as shown in Table-1, and also stability of the coated film was superior to the case of Example-2.

EXAMPLE 4

The procedure was carried out and evaluation was made analogously to Example-1 except that an aqueous solution of a mixture of ammonium perfluoroalkyl sulfonate ($D_1$) as water soluble fluorine compound and polyvinyl pyrrolidone ($C_1$) as water soluble macromolecular compound at ratio by weight of $D_1/C_1=6/4$ was coated.

Thus, good results were obtained as shown in Table-1, and also stability of the coated film was superior to the case of Example-2.

COMPARATIVE EXAMPLE 1

The procedure was carried out and evaluation was made analogously to Example-1 except that no anti-reflection film was formed. In this case, a relationship between thickness of photoresist coated films and pattern dimension is shown in FIG. 1 as solid-and-dotted line (pattern dimensional controllability: d'). The results of evaluation are shown in Table-1.

COMPARATIVE EXAMPLE 2

The pattern formation procedure was carried out analogously to Example-1 except that a fleon solution (concentration: 10 wt %) of perfluoroalkyl polyether (KRYTOX manufactured by Du Pont: registered trade mark) was used instead of the aqueous solution of ammonium perfluoroalkyl carboxylate. Coated film of perfluoroalkyl polyether could not be removed by rinsing with pure water and developer, however, and pattern formation could not be made after development.

COMPARATIVE EXAMPLE 3

An aqueous solution of sodium alginate, which is a water soluble polysaccharide, was coated instead of the aqueous solution of ammonium perfluoroalkyl carboxylate, and the remaining procedure was carried out and evaluation was made analogously to Example-1.

TABLE 1

|  | dimensional controllability (μm) | coating film property | removability |
|---|---|---|---|
| Example-1 | 0.05 | good | good |
| Example-2 | 0.05 | very good | good |
| Example-3 | 0.07 | very good | good |
| Example-4 | 0.07 | very good | good |
| Comparative Example-1 | 0.12 | — | — |
| Comparative Example-2 | — | good | — |
| Comparative Example-3 | 0.10 | good | good |

INDUSTRIAL APPLICABILITY

Since the composition according to the present invention can be coated on a photoresist in the form of an aqueous solution, not only the anti-reflection film can be formed easily, but also, the film can be removed easily by rinsing with water or by developing with aqueous alkaline solution. Further, with the pattern formation method according to the present invention, it is possible to form and remove the anti-reflection film in a convenient way and to form a pattern with a high dimensional accuracy. Therefore it is very useful in manufacturing LSI etc. industrially.

We claim:

1. An aqueous composition for forming an anti-reflection film on a resist surface, which comprises a water-soluble fluorine compound, which comprises at least perfluoroalkyl alcohol-ethylene oxide adducts as the water-soluble fluorine compound.

2. The composition according to claim 1, wherein the composition further contains at least one other water-soluble fluorine compound selected from the group consisting of (1) perfluoroalkyl carboxylic acids and salts thereof,
   (2) perfluoroalkyl sulfonic acids and salts thereof,
   (3) perfluoroalkyloxybenzene sulfonic acids and salts thereof,
   (4) perfluoroalkylbenzene sulfonic acids and salt thereof,
   (5) perfluoroalkyl amines and salts thereof, and
   (6) perfluoroalkyl sulfonamides.

3. The composition according to claim 2, wherein the other water-soluble fluorine compound is at least one compound selected from the group consisting of (1) perfluoroalkyl carboxylic acids and salts thereof,
   (2) perfluoroalkyl sulfonic acids and salts thereof, and
   (3) perfluoroalkyl amines and salts thereof.

4. The composition according to claim 2, wherein the other water-soluble fluorine compound is at least one compound selected from the group consisting of (1) perfluoroalkyl carboxylic acids and salts thereof, and
   (2) perfluoroalkyl sulfonic acids and salts thereof.

5. The composition according to claim 2, wherein for said mixture a ratio of perfluoroalkyl alcohol-ethylene oxide adducts (A) to said other water-soluble fluorine compound (B) is A/B=9/1–1/9, by weight.

6. The composition according to claim 5, wherein the ratio of perfluoroalkyl alcohol-ethylene oxide adducts (A) to said other water-soluble fluorine compound (B) is A/B=8/2–2/8, by weight.

7. The composition according to claim 1, wherein the aqueous solution of the water-soluble fluorine compound further contains a water-soluble macromolecular compound.

8. The composition according to claim 7, wherein said water-soluble macromolecular compound is at least one selected from the group consisting of starch, gelatin, casein, alginic acid, cellulose, polyvinyl alcohol, polyvinyl pyrrolidone, polyacrylic acid, polyacrylic amide, polymethacrylic acid, polymethyl vinyl ether, polyvinyl ethyl ether, and polyethylene glycol.

9. The composition according to claim 7, wherein the water-soluble macromolecular compound is polyvinyl pyrrolidone.

10. The composition according to claim 7, wherein a ratio of the water-soluble fluorine compound (C) to the water-soluble macromolecular compound (D) is C/D=9.5/0.5–0.5/9.5, by weight.

11. The composition according to claim 10, wherein the ratio of the water-soluble fluorine compound (C) to the water-soluble macromolecular compound (D) is C/D=9/1–4/6, by weight.

12. A pattern formation method, comprising:

a) coating a photoresist composition on a substrate;
   b) coating on the obtained photoresist an aqueous composition for forming an anti-reflection film on said resist surface;
   c) exposing the photoresist in the obtained surface anti-reflection film to form a specific pattern; and
   d) developing the photoresist with an aqueous alkaline solution, wherein said aqueous composition for forming said anti-reflection film on said resist surface comprises a water-soluble fluorine compound, which comprises at least perfluoroalkyl alcohol-ethylene oxide adducts as the water-soluble fluorine compound.

13. The pattern formation method according to claim 12, wherein the composition further contains at least one other water-soluble fluorine compound selected from the group consisting of (1) perfluoroalkyl carboxylic acids and salts thereof,
   (2) perfluoroalkyl sulfonic acids and salts thereof,
   (3) perfluoroalkyloxybenzene sulfonic acids and salts thereof,
   (4) perfluoroalkylbenzene sulfonic acids and salt thereof,
   (5) perfluoroalkyl amines and salts thereof, and
   (6) perfluoroalkyl sulfonamides.

14. The pattern formation method according to claim 13, wherein the other water-soluble fluorine compound is at least one compound selected from the group consisting of
(1) perfluoroalkyl carboxylic acids and salts thereof,
(2) perfluoroalkyl sulfonic acids and salts thereof, and
(3) perfluoroalkyl amines and salts thereof 15. The pattern formation method according to claim 13, wherein the other water-soluble fluorine compound is at least one compound selected from the group consisting of
(1) perfluoroalkyl carboxylic acids and salts thereof, and
(2) perfluoroalkyl sulfonic acids and salts thereof.

16. The pattern formation method according to claim 13, wherein for said mixture a ratio of perfluoroalkyl alcohol-ethylene oxide adducts (A) to said other water-soluble fluorine compound (B) is A/B=9/1–1/9, by weight.

17. The pattern formation method according to claim 16, wherein the ratio of perfluoroalkyl alcohol-ethylene oxide adducts, (A) to said other water-soluble fluorine compound (B) is A/B=8/2–2/8, by weight.

18. The pattern formation method according to claim 12, wherein the aqueous solution of the water-soluble fluorine compound further contains a water-soluble macromolecular compound.

19. The pattern formation method according to claim 18, wherein said water-soluble macromolecular compound is at least one selected from the group consisting of starch, gelatin, casein, alginic acid, cellulose, polyvinyl alcohol, polyvinyl pyrrolidone, polyacrylic acid, polyacrylic amide, polymethacrylic acid, polymethyl vinyl ether, polyvinyl ethyl ether, and polyethylene glycol.

20. The pattern formation method according to claim 19, wherein the water-soluble macromolecular compound is polyvinyl pyrrolidone.

21. The pattern formation method according to claim 18, wherein a ratio of the water-soluble fluorine compound (C) to the water-soluble macromolecular compound (D) is C/D= 9.5/0.5– 0.5/9.5, by weight.

22. The pattern formation method according to claim 21, wherein the ratio of the water-soluble fluorine compound (C) to the water-soluble macromolecular compound (D) is C/D=9/1–4/6, by weight.

23. The pattern formation method according to claim 12, which further comprises rinsing the substrate with water after pattern exposure but before development.

* * * * *